United States Patent
Chen et al.

(10) Patent No.: US 10,608,426 B2
(45) Date of Patent: Mar. 31, 2020

(54) HIGH TEMPERATURE PROTECTION SYSTEM FOR ADJUSTING DUTY CYCLE BY USING PULSE WIDTH MODULATION SIGNAL

(71) Applicant: Prolific Technology Inc., Taipei (TW)

(72) Inventors: Wan-Yang Chen, Kaohsiung (TW); Chih-Shih Yang, Hsinchu (TW); Jia-Jun Liu, Hsinchu County (TW)

(73) Assignee: Prolific Technology Inc., Taipei (TW)

( * ) Notice: Subject to any disclaimer, the term of this patent is extended or adjusted under 35 U.S.C. 154(b) by 470 days.

(21) Appl. No.: 15/358,110

(22) Filed: Nov. 21, 2016

(65) Prior Publication Data

US 2017/0194785 A1  Jul. 6, 2017

(30) Foreign Application Priority Data

Jan. 6, 2016 (TW) ............................. 105100230 A

(51) Int. Cl.
*H02H 5/04* (2006.01)
*H02H 7/20* (2006.01)
*H05K 7/20* (2006.01)
*G06F 1/20* (2006.01)

(52) U.S. Cl.
CPC .............. *H02H 7/20* (2013.01); *G06F 1/206* (2013.01); *H05K 7/20209* (2013.01)

(58) Field of Classification Search
CPC ........................................................ H02H 7/20
USPC ............................................................ 361/103
See application file for complete search history.

(56) References Cited

U.S. PATENT DOCUMENTS

| | | | |
|---|---|---|---|
| 6,336,080 B1* | 1/2002 | Atkinson | G05D 23/1917 702/132 |
| 6,914,764 B2* | 7/2005 | Clabes | G01K 7/203 361/103 |
| 7,847,525 B2 | 12/2010 | Okamoto | |
| 9,083,273 B2 | 7/2015 | Brannen | |
| 2004/0027763 A1 | 2/2004 | Dhuey | |
| 2008/0037187 A1 | 2/2008 | Liang | |
| 2009/0110028 A1* | 4/2009 | Goh | G01K 3/005 374/185 |
| 2009/0126100 A1* | 5/2009 | Kenoyer | F24H 1/0081 4/559 |

(Continued)

FOREIGN PATENT DOCUMENTS

| CN | 2862170 Y | 1/2007 |
|---|---|---|
| CN | 101813097 A | 8/2010 |

(Continued)

*Primary Examiner* — Thienvu V Tran
*Assistant Examiner* — Lucy M Thomas
(74) *Attorney, Agent, or Firm* — Winston Hsu

(57) ABSTRACT

High temperature protection system includes a thermal detection and control circuit, a pulse width modulation signal output circuit, a driving circuit, and a coil module. The thermal detection and control circuit is used for detecting a temperature and outputting at least one corresponding control signal. The pulse width modulation signal output circuit is coupled to the thermal detection and control circuit for generating a pulse width modulation signal according to the at least one control signal. The driving circuit is coupled to the pulse width modulation signal for generating at least one driving voltage. The coil module is coupled to the driving circuit and is operated according to the at least one driving voltage.

3 Claims, 2 Drawing Sheets

(56) References Cited

U.S. PATENT DOCUMENTS

| | | |
|---|---|---|
| 2010/0109591 A1 | 5/2010 | Yeh |
| 2012/0112678 A1 | 5/2012 | Huang |
| 2012/0223666 A1 | 9/2012 | Huang |

FOREIGN PATENT DOCUMENTS

| | | |
|---|---|---|
| CN | 201846296 U | 5/2011 |
| CN | 102465908 A | 5/2012 |
| CN | 102654131 A | 9/2012 |
| TW | I340516 | 4/2011 |
| TW | I473402 B | 2/2015 |

* cited by examiner

HIGH TEMPERATURE PROTECTION SYSTEM FOR ADJUSTING DUTY CYCLE BY USING PULSE WIDTH MODULATION SIGNAL

BACKGROUND OF THE INVENTION

1. Field of the Invention

The present invention illustrates a high temperature protection system, and more particularly, the high temperature protection system for adjusting duty cycle by using a pulse width modulation signal.

2. Description of the Prior Art

With the advancement of techniques, various electrical devices with high operational performance are widely adopted. Nowadays, most electrical devices are required to perform high processing speed and low response time in conjunction with a high-level processor integrated to a micro volume circuit. Thus, the electrical devices can be operated by users at any time and in any place. For example, the specification of iPhone 5s states that an A7-typed processor is used. The specification of iPhone 6 Plus states that an A8-typed processor is used. Another example is that the central processing unit (CPU) of the personal computer is upgraded from Intel® Core™ i5 to Intel® Core™ i7. Specifically, power consumption and heat generation of the electrical device are increased since the clock frequency of the processor is increased. Thus, the performance of heat dissipation components such as heat dissipation fans, a water cooling system, thermally conductive adhesive, and a heat sink attracts more attention. Among these heat dissipation devices, a water cooling system has the best heat dissipation performance yet has a large circuit volume, high cost, and high noise. Thermally conductive adhesives and heat sinks have smaller volume with inferior heat dissipation performance since they only use a medium for conducting heat. As a result, heat dissipation fans become the most popular devices for dissipating heat in general electric devices.

Generally, when the electrical device is operated, a thermal detection module inside an integrated circuit of a fan system is enabled. When an abnormally high temperature is detected by the thermal detection module (i.e., the abnormally high temperature is occurred when the fan system is overloaded or heat dissipation between PN-junctions of the integrated circuit is failed), the thermal detection module controls the fan system to pause all operations. As a result, when the abnormally high temperature is detected, the fan system is paused directly, thereby leading severe damages of the device (i.e., CPU) which needs to dissipate heat since a function of heat dissipation is also paused.

SUMMARY OF THE INVENTION

In an embodiment of the present invention, a high temperature protection system is disclosed. The high temperature protection system includes a thermal detection and control circuit, a pulse width modulation signal output circuit, a driving circuit, and a coil module. The thermal detection and control circuit is used for detecting a temperature and outputting at least one control signal. The pulse width modulation signal output circuit is coupled to the thermal detection and control circuit for generating a pulse width modulation signal according to the at least one control signal. The driving circuit is coupled to the pulse width modulation signal output circuit for generating at least one driving voltage according to the pulse width modulation signal. The coil module is coupled to the driving circuit and is operated according to the at least one driving voltage. The pulse width modulation signal output circuit generates the pulse width modulation signal to protect the coil module according to a thermal detection result from the thermal detection and control circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
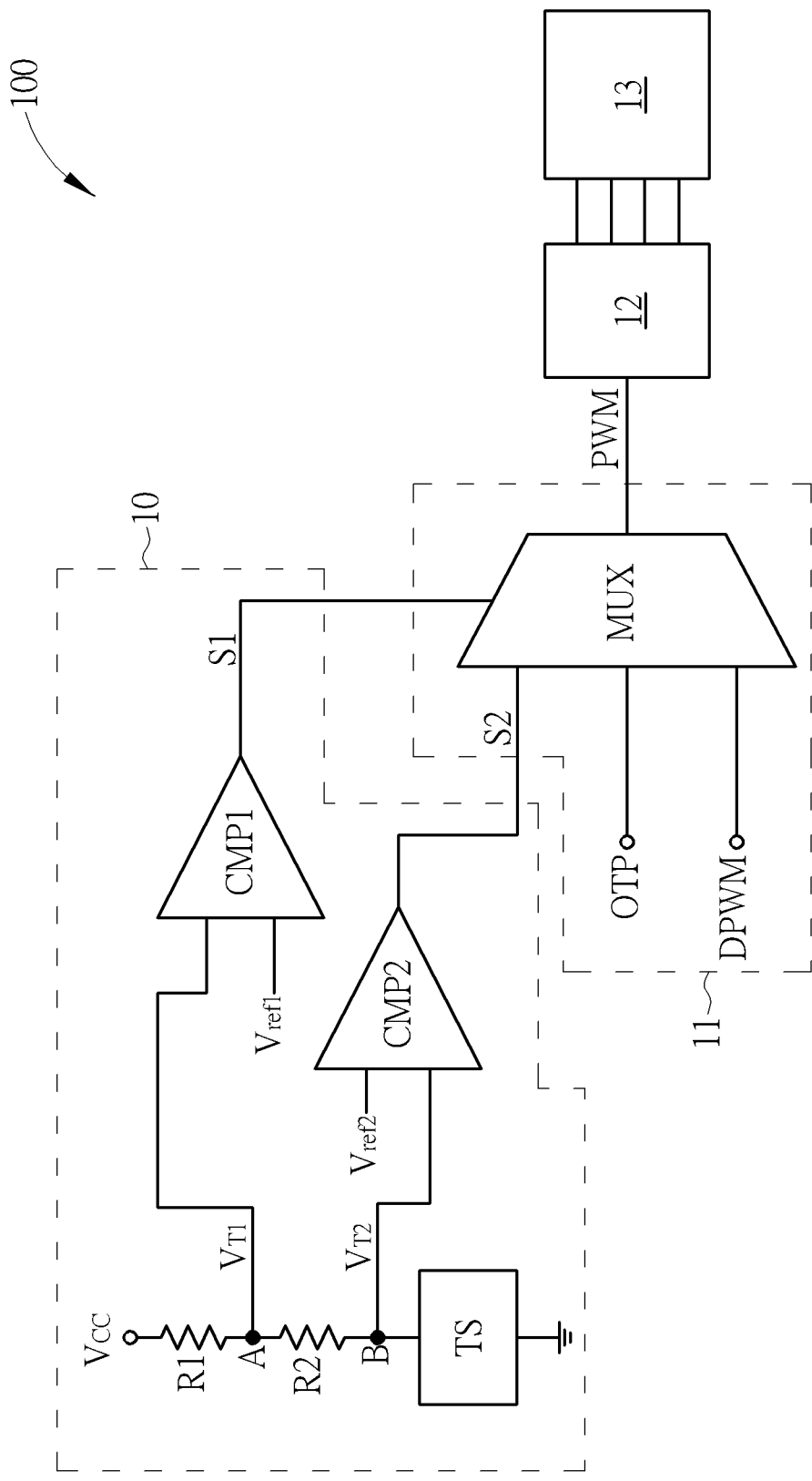
FIG. 1 illustrates a circuit structure of a high temperature protection system according to a first embodiment of the present invention.

FIG. 1 illustrates a circuit structure of a high temperature protection system 100. The high temperature protection system 100 includes a thermal detection and control circuit 10, a pulse width modulation signal output circuit 11, a driving circuit 12, and a coil module 13. The thermal detection and control circuit 10 is used for detecting a temperature of the high temperature protection system 100 (i.e., for example, the temperature of an integrated circuit inside the high temperature protection system 100). The thermal detection and control circuit 10 can output at least one control signal. The pulse width modulation signal output circuit 11 is coupled to the thermal detection and control circuit 10 for generating a pulse width modulation signal PWM according to the at least one control signal. The driving circuit 12 is coupled to the pulse width modulation signal output circuit 11 for generating at least one driving voltage according to the pulse width modulation signal PWM. The coil module 13 is coupled to the driving circuit 12 and is operated according to the at least one driving voltage. In the high temperature protection system 100, the thermal detection and control circuit 10 includes a resistor R1, a resistor R2, a thermal sensor TS, a comparator CMP1, and a comparator CMP2. The resistor R1 includes a first terminal for receiving a circuit voltage Vcc (i.e., the circuit voltage Vcc can be a predetermined high voltage) and a second terminal. The resistor R2 includes a first terminal coupled to the second terminal of the resistor R1 and a second terminal. In other words, the resistor R1 and the resistor R2 can be coupled in a series connection. The thermal sensor TS includes a first terminal coupled to the second terminal of the resistor R2 and a second terminal coupled to a ground terminal. The thermal sensor TS can be any typed thermal sensor, such as a thermistor. The comparator CMP1 includes a first input terminal coupled to the first terminal of the resistor R2, a second input terminal for receiving a reference voltage $V_{ref1}$, and an output terminal for outputting a control signal S1 to the pulse width modulation signal output circuit 11. The comparator CMP2 includes a first input terminal coupled to the second terminal of the resistor R2, a second input terminal for receiving a reference voltage $V_{ref2}$, and an output terminal for outputting a control signal S2 to the pulse width modulation signal output circuit 11. Specifically, the reference voltage $V_{ref1}$ and the reference voltage $V_{ref2}$ can be two user-defined voltages. The reference voltage $V_{ref1}$ and the reference voltage $V_{ref2}$ can also be two system default voltages. An operational mode of the thermal detection and control circuit 10 is illustrated below. A voltage of the node A and a voltage of the node B can be controlled by the thermal sensor TS. Here, the voltage of the node A can be defined as $V_{T1}$. The voltage of the node B can be defined as $V_{T2}$. The voltage $V_{T1}$ and the voltage $V_{T2}$ can be regarded as two divided voltages from the circuit voltage Vcc. The voltage $V_{T1}$ and the voltage $V_{T2}$ can be varied with a temperature detected by the thermal sensor TS. For example, when the high temperature is detected, the voltage $V_{T1}$ and the voltage $V_{T2}$ are increased. The voltage $V_{T1}$ is compared with the reference voltage $V_{ref1}$ through the comparator CMP1. When the voltage $V_{T1}$ is greater than the reference voltage $V_{ref1}$, the comparator CMP1 outputs the control signal S1 with a first voltage level. When the voltage $V_{T1}$ is smaller than the reference voltage $V_{ref1}$, the comparator CMP1 outputs the control signal S1 with a second voltage level. Similarly, when the voltage $V_{T2}$ is greater than the reference voltage $V_{ref2}$, the comparator CMP2 outputs the control signal S2 with a first voltage level. When the voltage $V_{T2}$ is smaller than the reference voltage $V_{ref2}$, the comparator CMP2 outputs the control signal S2 with a second voltage level. The control signal S1 and the control signal S2 are received by the pulse width modulation signal output circuit 11.

In the high temperature protection system 100, the pulse width modulation signal output circuit 11 includes a multiplexer MUX. The multiplexer MUX includes a first input terminal for receiving a first signal OTP, a second input terminal for receiving a second signal DPWM, a first control terminal coupled to the output terminal of the comparator CMP1 for receiving the control signal S1, a second control terminal coupled to the output terminal of the comparator CMP2 for receiving the control signal S2, and an output terminal for outputting the pulse width modulation signal PWM to the driving circuit 12. Specifically, the first signal OTP can be a user-defined pulse width modulation signal. The second signal DPWM can be a system default pulse width modulation signal. The control signal S1 can control the multiplexer MUX to operate in an ON-state or an OFF-state. The control signal S2 can control the multiplexer MUX to select an appropriate output signal. An operation of the pulse width modulation signal output circuit 11 is illustrated below. When the multiplexer MUX receives the control signal S1 with a second voltage level ($V_{T1}<V_{ref1}$), the multiplexer MUX is operated in the ON-state (or say, enabled state). At the moment, when the multiplexer MUX receives the control signal S2 with a second voltage level ($V_{T2}<V_{ref2}$), the multiplexer MUX outputs the pulse width modulation signal PWM as the system default pulse width modulation signal (i.e., the second signal DPWM). Conversely, when the multiplexer MUX receives the control signal S2 with a first voltage level ($V_{T2}>V_{ref2}$), the multiplexer MUX outputs the pulse width modulation signal PWM as the user-defined pulse width modulation signal (i.e., the first signal OTP). When the multiplexer MUX receives the control signal S1 with a first voltage level ($V_{T1}>V_{ref1}$), the multiplexer MUX is operated in the OFF-state (or say, disabled state). At the moment, the pulse width modulation signal PWM becomes a time-invariant low voltage signal. After the driving circuit 12 receives a selected pulse width modulation signal PWM, the driving circuit 12 generates corresponding at least one driving voltage to the coil module 13. Particularly, the at least one driving voltage generated by the driving circuit 12 can be of arbitrary voltage type, such as non-differential driving voltages or differential driving voltages. When the coil module 13 is a bridge-based coil module, the driving circuit 12 can generate multi-voltages corresponding to terminals of the coil module 13. For presentation completeness, principle of the circuit protection in the high temperature protection system 100 is illustrated below.

When a temperature detected by the thermal detection and control circuit 10 is a normal temperature of operation, the voltage $V_{T1}$ and the voltage $V_{T2}$ satisfy $V_{T1}<V_{ref1}$ and $V_{T2}<V_{ref2}$. Thus, the comparator CMP1 outputs the control signal S1 with a second voltage level. The comparator CMP2 outputs the control signal S2 with a second voltage level. As a result, the multiplexer MUX is operated in an ON-state (enabled state) and can output the pulse width modulation signal PWM as the system default pulse width modulation signal (i.e., the second signal DPWM). The coil module 13 is operated with a high duty cycle or a full duty cycle. When a temperature detected by the thermal detection and control circuit 10 is an abnormally high temperature of operation, the voltage $V_{T1}$ and the voltage $V_{T2}$ satisfy $V_{T1}<V_{ref1}$ and $V_{T2}>V_{ref2}$. Thus, the comparator CMP1 outputs the control signal S1 with a second voltage level. The comparator CMP2 outputs the control signal S2 with a first voltage level. As a result, the multiplexer MUX is operated in an ON-state (enabled state) and can output the pulse width modulation signal PWM as the user-defined pulse width modulation signal (i.e., the first signal OTP). The coil module 13 is operated with a low duty cycle (i.e., a user-defined low duty cycle). When a temperature detected by the thermal detection and control circuit 10 is an extremely high temperature of operation, the voltage $V_{T1}$ and the voltage $V_{T2}$ satisfy $V_{T1}>V_{ref1}$ and $V_{T2}>V_{ref2}$. Thus, the comparator CMP1 outputs the control signal S1 with a first voltage level. The multiplexer MUX is operated in an OFF-state (disabled state). As a result, the pulse width modulation signal PWM becomes a time-invariant low voltage signal. The coil module 13 is paused for avoiding thermal damage. In conclusion, for the high temperature protection system 100, when the temperature detected by the thermal detection and control circuit 10 is the abnormally high temperature of operation but is tolerable for circuit components (i.e., the abnormally high temperature may not directly damage the circuit components but may shorten a life time of the circuit components), the coil module 13 can be operated with a user-defined duty cycle. In other words, when the abnormally high temperature of operation is detected, the operational mode of the coil module 13 with low duty cycle can be automatically performed. By doing so, under an abnormally high temperature condition, the high temperature protection system 100 is capable of heat dissipation function.

Briefly, several operation modes are introduced to the high temperature protection system 100. (A) When the temperature is detected as a normal temperature of operation, the coil module 13 is operated with a high duty cycle mode or a full duty cycle mode. (B) When the temperature is detected as an abnormally high temperature of operation, the coil module 13 is operated with a user-defined low duty cycle mode. (C) When the temperature is detected as an extremely high temperature of operation, the coil module 13 is paused for avoiding thermal damage or burnout.

Figure 2:
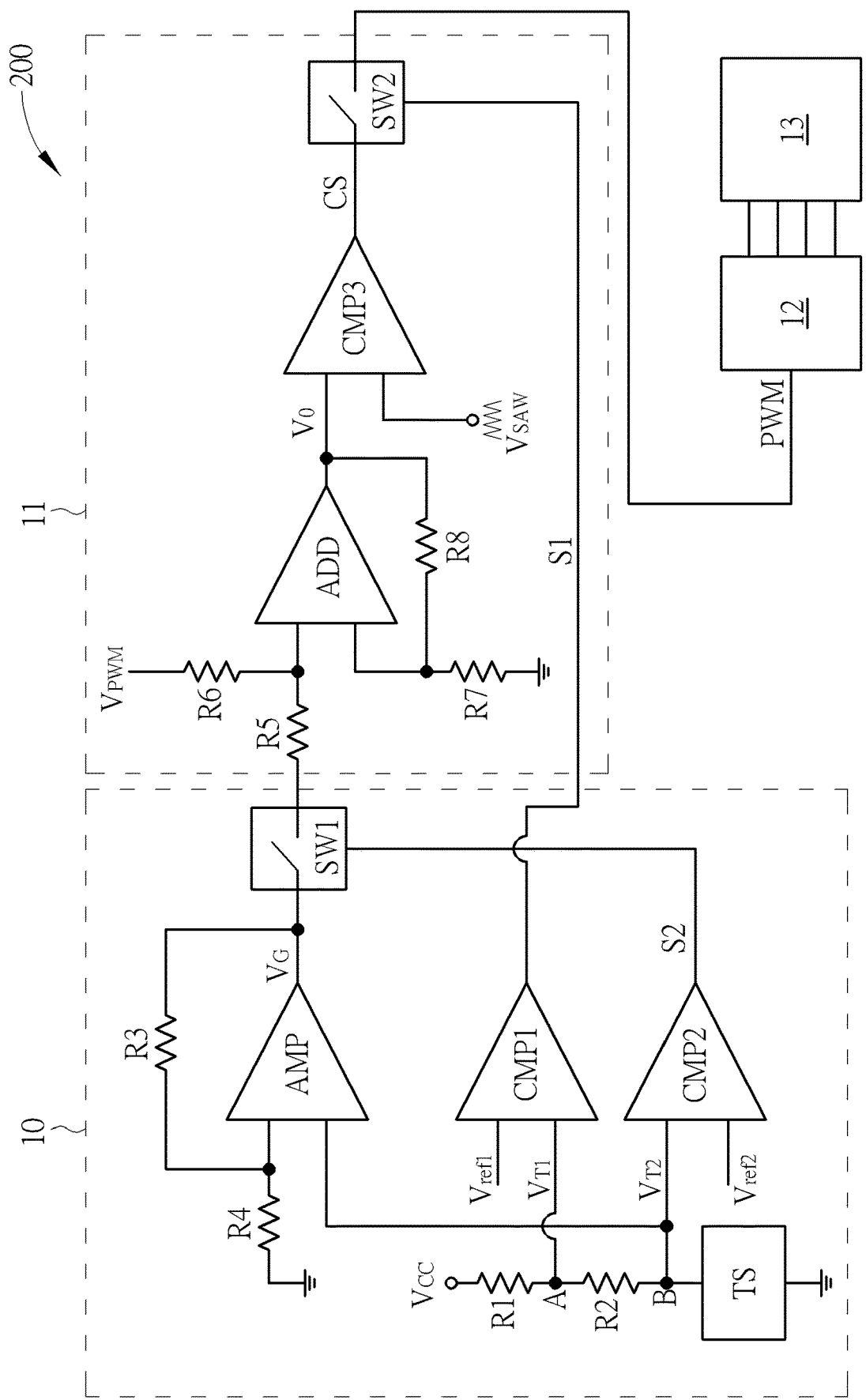
FIG. 2 illustrates a circuit structure of a high temperature protection system according to a second embodiment of the present invention.

FIG. 2 illustrates a circuit structure of a high temperature protection system 200. The high temperature protection system 200 includes a thermal detection and control circuit 10, a pulse width modulation signal output circuit 11, a driving circuit 12, and a coil module 13. The thermal detection and control circuit 10 is used for detecting a temperature of the high temperature protection system 200

(i.e., for example, the temperature of an integrated circuit inside the high temperature protection system 200). The thermal detection and control circuit 10 can output at least one control signal. The pulse width modulation signal output circuit 11 is coupled to the thermal detection and control circuit 10 for generating a pulse width modulation signal PWM according to the at least one control signal. The driving circuit 12 is coupled to the pulse width modulation signal output circuit 11 for generating at least one driving voltage according to the pulse width modulation signal PWM. The coil module 13 is coupled to the driving circuit 12 and is operated according to the at least one driving voltage. In the high temperature protection system 200, the thermal detection and control circuit 10 includes a resistor R1, a resistor R2, a thermal sensor TS, a comparator CMP1, a comparator CMP2, an amplifier AMP, a resistor R3, a resistor R4, and a switch SW1. Particularly, functions and allocations of the resistor R1, the resistor R2, the thermal sensor TS, the comparator CMP1, the comparator CMP2 in FIG. 2 are similar to the circuit components of the high temperature protection system 100 illustrated in FIG. 1. Thus, illustrations of these circuit components are omitted here. The amplifier AMP includes a first input terminal, a second input terminal coupled to a first terminal (node B) of the thermal sensor, and an output terminal for outputting a voltage $V_G$ with a gain factor. The resistor R3 includes a first terminal coupled to the first input terminal of the amplifier AMP and a second terminal coupled to the output terminal of the amplifier AMP. The resistor R4 includes a first terminal coupled to a ground terminal and a second terminal coupled to the first terminal of the resistor R3. The switch SW1 includes a control terminal coupled to an output terminal of the comparator CMP2 for receiving a control signal S2, a first terminal coupled to the output terminal of the amplifier AMP, and a second terminal for outputting the voltage $V_G$ with the gain factor to the pulse width modulation signal output circuit 11 when the switch SW1 is operated in a short state. An operational mode of the thermal detection and control circuit 10 is illustrated below. When a voltage $V_{T1}$ of node A is greater than a reference voltage $V_{ref1}$, the comparator CMP1 outputs the control signal S1 with a first voltage level. When the voltage $V_{T1}$ of node A is smaller than the reference voltage $V_{ref1}$, the comparator CMP1 outputs the control signal S1 with a second voltage level. The control signal S1 is received by the pulse width modulation signal output circuit 11. When the voltage $V_{T2}$ of node B is greater than a reference voltage $V_{ref2}$, the comparator CMP2 outputs the control signal S2 with a first voltage level. The control signal S2 with the first voltage level can control the switch SW1 to operate in the short state. When the voltage $V_{T2}$ of node B is smaller than a reference voltage $V_{ref2}$, the comparator CMP2 outputs the control signal S2 with a second voltage level. The control signal S2 with the second voltage level can control the switch SW1 to operate in an open state. The voltage $V_G$ with the gain factor outputted from the amplifier AMP is relevant to the voltage $V_{T2}$ of node B. For example, the voltage $V_G$ with the gain factor α satisfies a condition of $V_G=\alpha V_{T2}$, wherein the gain factor α is correlated with the resistor R3 and the resistor R4. Here, the resistor R3 and the resistor R4 can be two resistors with different user-defined resistances. In other words, a proportion between the voltage $V_G$ with the gain factor outputted from the amplifier AMP and the voltage $V_{T2}$ can be defined by user. When the switch SW1 is operated in the short state, the voltage $V_G$ with the gain factor can be received by the pulse width modulation signal output circuit 11 through the switch SW1. Conversely, when the switch SW1 is operated in the open state, the second terminal of the switch SW1 becomes a floating terminal. Thus, the voltage $V_G$ with the gain factor cannot be received by the pulse width modulation signal output circuit 11.

In the high temperature protection system 200, the pulse width modulation signal output circuit 11 includes a resistor R5, a resistor R6, an adder ADD, a resistor R7, a resistor R8, a comparator CMP3, and a switch SW2. The resistor R5 includes a first terminal coupled to the second terminal of the switch SW1 and the second terminal. The resistor R6 includes a first terminal for receiving a voltage $V_{PWM}$ with a direct current and a second terminal coupled to the second terminal of the resistor R5. The adder ADD includes a first input terminal coupled to the second terminal of the resistor R6, a second input terminal, and an output terminal for generating a cumulative voltage $V_0$. The resistor R7 includes a first terminal coupled to the second input terminal of the adder ADD and a second terminal coupled to a ground terminal. The resistor R8 includes a first terminal coupled to the first terminal of the resistor R7 and a second terminal coupled to the output terminal of the adder ADD. The comparator CMP3 includes a first input terminal coupled to the output terminal of the adder ADD for receiving the cumulative voltage $V_0$, a second input terminal for receiving a saw-tooth signal Vsaw, and an output terminal for outputting a comparison signal CS. The switch SW2 includes a control terminal coupled to the output terminal of the comparator CMP1 for receiving the control signal S1, a first terminal coupled to the output terminal of the comparator CMP3 for receiving the comparison signal CS, and a second terminal for outputting the pulse width modulation signal PWM to the driving circuit 12 when the switch SW2 is operated on a short state. An operation of the pulse width modulation signal output circuit 11 is illustrated as below. When the switch SW2 receives the control signal S1 with the second voltage level ($V_{T1}<V_{ref1}$), the switch SW2 is operated in the short state. At the moment, when the switch SW1 of the thermal detection and control circuit 10 is operated on the open state ($V_{T2}<V_{ref2}$), the cumulative voltage $V_0$ is only relevant to the voltage $V_{PWM}$ with the direct current. For example, the cumulative voltage $V_0$ can be generated by introducing a gain multiplied by the voltage $V_{PWM}$. Then, the cumulative voltage $V_0$ is compared with the saw-tooth signal Vsaw through the comparator CMP3. The comparator CMP3 further generates a comparison signal CS with fixed pulse width. The comparison signal CS becomes the pulse width modulation signal PWM through the switch SW2 and is received by the driving circuit 12. When the switch SW2 receives the control signal S1 with the second voltage level ($V_{T1}<V_{ref1}$), the switch SW2 is operated in the short state. At the moment, when the switch SW1 of the thermal detection and control circuit 10 is operated in the short state ($V_{T2}>V_{ref2}$), the cumulative voltage $V_0$ is generated from the voltage $V_{PWM}$ with the direct current and the voltage $V_G$ with the gain factor according to a linear correlation. For example, when the adder ADD is a non-inverting adder, the cumulative voltage $V_0$ can be written by $V_0=\omega^*(\beta^*V_G+\gamma^*V_{PWM})$, wherein a constant ω denotes a resistance ratio as (R7+R8)/R7. A constant β denotes a resistance ratio as R6/(R5+R6). A constant γ denotes a resistance ratio as R5/(R5+R6). In other words, when the voltage VT2 of node B is increased, the voltage VG is increased. As a result, the cumulative voltage $V_0$ is increased linearly. As aforementioned illustration, the cumulative voltage $V_0$ is further compared with the saw-tooth signal Vsaw by using the comparator CMP3. Specifically, the saw-tooth signal Vsaw is a deterministic fixed signal. Thus, when the cumulative voltage $V_O$ is increased, time intervals corresponding to the saw-tooth signal Vsaw being greater than the cumulative voltage $V_O$ are decreased. As a result, the comparison signal CS outputting from the comparator CMP3 can be regarded as the pulse width modulation signal with a reduced pulse width. Then, the comparison signal CS becomes the pulse width modulation signal PWM through the switch SW2 and is received by the driving circuit 12. In another case, when the switch SW2 receives the control signal S1 with the first voltage level ($V_{T1}>V_{ref1}$), the switch SW2 is operated in the open state. Here, the pulse width modulation signal PWM becomes a time-invariant low voltage signal. After the driving circuit 12 receives a specific pulse width modulation signal PWM, the driving circuit 12 generates corresponding at least one driving voltage to the coil module 13. Particularly, the at least one driving voltage generated by the driving circuit 12 can be of arbitrary voltage type, such as non-differential driving voltages or differential driving voltages. When the coil module 13 is a bridge-based coil module, the driving circuit 12 can generate multi-voltages corresponding to terminals of the coil module 13. For presentation completeness, principle of the circuit protection in the high temperature protection system 200 is illustrated below.

When a temperature detected by the thermal detection and control circuit 10 is a normal temperature of operation, the voltage $V_{T1}$ and the voltage $V_{T2}$ satisfy $V_{T1}<V_{ref1}$ and $V_{T2}<V_{ref2}$. Thus, the comparator CMP1 outputs the control signal S1 with a second voltage level. The comparator CMP2 outputs the control signal S2 with a second voltage level. As a result, the switch SW1 is operated in an open state. The switch SW2 is operated in a short state. The cumulative voltage $V_O$ outputted from the adder ADD is only relevant to the voltage $V_{PWM}$ with the direct current. The pulse width modulation signal PWM is the comparison signal CS with fixed pulse width. The coil module 13 is operated with a high duty cycle or a full duty cycle. When a temperature detected by the thermal detection and control circuit 10 is an abnormally high temperature of operation, the voltage $V_{T1}$ and the voltage $V_{T2}$ satisfy $V_{T1}<V_{ref1}$ and $V_{T2}>V_{ref2}$. Thus, the comparator CMP1 outputs the control signal S1 with a second voltage level. The comparator CMP2 outputs the control signal S2 with a first voltage level. As a result, the switch SW1 and the switch SW2 are operated in the short state. The cumulative voltage $V_O$ outputted from the adder ADD can be generated by the voltage $V_G$ with a gain factor and the voltage $V_{PWM}$ with the direct current according to a linear correlation. Specifically, when the cumulative voltage $V_O$ is increased, a pulse width of the comparison signal CS outputted from the comparator CMP3 is decreased. Equivalently, in this case, when the temperature detected by the thermal detection and control circuit 10 is increased, the pulse width of the pulse width modulation signal PWM is decreased linearly, leading duty cycle reduction for operating the coil module 13. When a temperature detected by the thermal detection and control circuit 10 is an extremely high temperature of operation, the voltage $V_{T1}$ and the voltage $V_{T2}$ satisfy $V_{T1}>V_{ref1}$ and $V_{T2}>V_{ref2}$. Since the comparator CMP1 outputs the control signal S1 with a first voltage level, the switch SW2 is operated in the open state. As a result, the pulse width modulation signal PWM becomes a time-invariant low voltage signal. The coil module 13 is paused for avoiding thermal damage. In conclusion, for the high temperature protection system 200, when the temperature detected by the thermal detection and control circuit 10 is the abnormally high temperature of operation but is tolerable for circuit components (i.e., the abnormally high temperature may not directly damage the circuit components but may shorten a life time of the circuit components), the coil module 13 can be operated by decreasing a proportion of duty cycle based on a thermal detection result (i.e., temperature value). In other words, when the abnormally high temperature of operation is detected, the operational mode of the coil module 13 with low duty cycle can be automatically performed. By doing so, under an abnormally high temperature condition, the high temperature protection system 200 is capable of heat dissipation function.

Briefly, several operation modes are introduced to the high temperature protection system 200. (A) When the temperature is detected as a normal temperature of operation, the coil module 13 is operated with a high duty cycle mode or a full duty cycle mode. (B) When the temperature is detected as an abnormally high temperature of operation, the coil module 13 is operated by decreasing a proportion of duty cycle based on a thermal detection result. (C) When the temperature is detected as an extremely high temperature of operation, the coil module 13 is paused for avoiding thermal damage or burnout.

To sum up, the present invention discloses a high temperature protection system. Several embodiments of the high temperature protection system are introduced to protect circuit components under abnormally high temperature. Several operational modes of the high temperature protection system are also introduced and can be integrated below. (A) When the temperature is detected as a normal temperature of operation, the coil module is operated with a high duty cycle mode, a fixed duty cycle mode, or a full duty cycle mode. (B) When the temperature is detected as an abnormally high temperature of operation, the coil module is operated by a user-defined low duty cycle mode. (C) When the temperature is detected as an abnormally high temperature of operation, the coil module is operated by decreasing a proportion of duty cycle based on a thermal detection result. (D) When the temperature is detected as an extremely high temperature of operation, the coil module is paused for avoiding thermal damage or burnout. Thus, when the detected temperature is the abnormally high temperature of operation but is tolerable for circuit components, the coil module maintains the operation by using the appropriate duty cycle. Thus, the high temperature protection system is capable of heat dissipation function under abnormally high temperature condition. Particularly, for example, when the high temperature protection system is considered as a fan system, the conventional high temperature protection system may directly disable a power source (or the coil module) for protecting circuit components when the abnormally high temperature is detected, thereby leading thermal damages of the device (i.e., CPU) which needs to dissipate heat since the function of heat dissipation is also paused. As a result, since the coil module of the present invention maintains the operation by using the appropriate duty cycle, when the abnormally high temperature is detected, the high temperature protection system still provides high reliability for protecting circuit in conjunction with satisfactory operative adaptability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high temperature protection system comprising:
a thermal detection and control circuit configured to detect a temperature and output at least one control signal, the thermal detection and control circuit comprising:
   a first resistor comprising:
      a first terminal configured to receive a circuit voltage; and
      a second terminal;
   a second resistor comprising:
      a first terminal coupled to the second terminal of the first resistor; and
      a second terminal;
   a thermal sensor comprising:
      a first terminal coupled to the second terminal of the second resistor; and
      a second terminal coupled to a ground terminal;
   a first comparator comprising:
      a first input terminal coupled to the first terminal of the second resistor;
      a second input terminal configured to receive a first reference voltage; and
      an output terminal configured to output a first control signal; and
   a second comparator comprising:
      a first input terminal coupled to the second terminal of the second resistor;
      a second input terminal configured to receive a second reference voltage; and
      an output terminal configured to output a second control signal;
a pulse width modulation signal output circuit coupled to the thermal detection and control circuit and configured to receive the first control signal and the second control signal and generate a pulse width modulation signal according to the first control signal and the second control signal;
a driving circuit coupled to the pulse width modulation signal output circuit and configured to generate at least one driving voltage according to the pulse width modulation signal; and
a coil module coupled to the driving circuit and operated according to the at least one driving voltage;
wherein the pulse width modulation signal output circuit generates the pulse width modulation signal to protect the coil module according to a thermal detection result from the thermal detection and control circuit; and
wherein when a voltage of the second terminal of the first resistor is smaller than the first reference voltage and a voltage of the second terminal of the second resistor is smaller than the second reference voltage, the pulse width modulation signal output circuit outputs a system default pulse width modulation signal for driving the coil module, when a voltage of the second terminal of the first resistor is smaller than the first reference voltage and a voltage of the second terminal of the second resistor is greater than the second reference voltage, the pulse width modulation signal output circuit outputs a user-defined pulse width modulation signal for driving the coil module, when a voltage of the second terminal of the first resistor is greater than the first reference voltage and a voltage of the second terminal of the second resistor is greater than the second reference voltage, the pulse width modulation signal output circuit outputs a time-invariant low voltage signal for disabling the coil module, and a duty cycle of the user-defined pulse width modulation signal is smaller than a duty cycle of the system default pulse width modulation signal.

2. The system of claim 1, wherein the first reference voltage and the second reference voltage are two user-defined voltages.

3. The system of claim 1, wherein the pulse width modulation signal output circuit comprises
a multiplexer, and the multiplexer comprises:
   a first input terminal configured to receive a first signal;
   a second input terminal configured to receive a second signal;
   a first control terminal coupled to the output terminal of the first comparator and configured to receive the first control signal;
   a second control terminal coupled to the output terminal of the second comparator and configured to receive the second control signal; and
   an output terminal configured to output the pulse width modulation signal to the driving circuit.

* * * * *